(12) United States Patent
Smith et al.

(10) Patent No.: US 8,985,507 B2
(45) Date of Patent: Mar. 24, 2015

(54) GAS TURBINE ENGINE NACELLE HAVING A SYMMETRIC FLOWPATH AND DESIGN METHOD THEREOF

(71) Applicant: Rolls-Royce PLC, London (GB)

(72) Inventors: Angus Roy Smith, Derby (GB); Dimitris Arzoglou, Derby (GB)

(73) Assignee: Rolls-Royce PLC, London (GB)

( * ) Notice: Subject to any disclaimer, the term of this patent is extended or adjusted under 35 U.S.C. 154(b) by 0 days.

(21) Appl. No.: 13/761,475

(22) Filed: Feb. 7, 2013

(65) Prior Publication Data

US 2013/0199624 A1 Aug. 8, 2013

Related U.S. Application Data

(62) Division of application No. 12/495,867, filed on Jul. 1, 2009.

(30) Foreign Application Priority Data

Jul. 24, 2008 (GB) .................................. 0813482.7

(51) Int. Cl.
 B64D 33/02 (2006.01)
 F02C 7/04 (2006.01)
 F02K 3/06 (2006.01)
 G06F 17/50 (2006.01)

(52) U.S. Cl.
 CPC . *F02C 7/04* (2013.01); *B64D 33/02* (2013.01); *F02K 3/06* (2013.01); *G06F 17/50* (2013.01)
 USPC ............................................ 244/53 B; 703/1

(58) Field of Classification Search
 USPC ......... 244/53 B, 134 A; 60/39.092; 137/15.1; 181/214; 55/306
 See application file for complete search history.

(56) References Cited

U.S. PATENT DOCUMENTS

| | | | |
|---|---|---|---|
| 3,222,863 A | 12/1965 | Klees et al. |
| 3,618,876 A | 11/1971 | Skidmore et al. |
| 3,664,612 A | 5/1972 | Skidmore et al. |
| 3,763,874 A | 10/1973 | Wilde et al. |
| 3,765,623 A | 10/1973 | Donelson et al. |
| 4,012,013 A | 3/1977 | Ball et al. |

(Continued)

FOREIGN PATENT DOCUMENTS

| | | |
|---|---|---|
| EP | 2 011 987 A2 | 1/2009 |
| GB | 2259115 A | 3/1993 |
| GB | 2364366 A | 1/2002 |

OTHER PUBLICATIONS

"Manufacture" ahdictionary.com. The American Heritage dictionary, 2014. Web. Sep. 9, 2014.*

(Continued)

*Primary Examiner* — Tien Dinh
*Assistant Examiner* — Michael A Fabula
(74) *Attorney, Agent, or Firm* — Oliff PLC (57) ABSTRACT

A method of designing a nacelle for a gas turbine engine includes defining an initial geometry for the nacelle, pivoting, at each of one or more positions on a highlight and in a plane of a respective longitudinal section, a front portion of a section of an intake lip lying in the respective longitudinal section about the highlight, and obtaining an altered geometry for the nacelle by adjusting surfaces of the intake neighboring the pivoted front portion to smoothly blend the surfaces of the pivoted front portion to unadjusted surfaces of the intake further removed from the pivoted front portion.

8 Claims, 5 Drawing Sheets

(56) References Cited

U.S. PATENT DOCUMENTS

| | | |
|---|---|---|
| 4,220,171 A | 9/1980 | Ruehr et al. |
| 4,817,756 A | 4/1989 | Carr et al. |
| 5,000,399 A | 3/1991 | Readnour et al. |
| 5,145,126 A | 9/1992 | Patilla |
| 5,156,362 A | 10/1992 | Leon |
| 5,915,403 A | 6/1999 | McConachie et al. |
| 6,089,505 A | 7/2000 | Gruensfelder et al. |
| 6,231,006 B1 | 5/2001 | Gruensfelder et al. |
| 6,260,567 B1 | 7/2001 | Gruensfelder et al. |
| 6,708,711 B2 | 3/2004 | Surply et al. |
| 2008/0283676 A1 | 11/2008 | Jain et al. |
| 2009/0008508 A1 | 1/2009 | Jain et al. |

OTHER PUBLICATIONS

"Produce" ahdictionary.com. The American Heritage dictionary, 2014. Web. Sep. 9, 2014.*
Sep. 7, 2012 Office Action issued in U.S. Appl. No. 12/495,867.
Mar. 30, 2012 Office Action issued in U.S. Appl. No. 12/495,867.
European Search Report issued in European Patent Application No. 09 25 1522 dated Feb. 6, 2014.

* cited by examiner

GAS TURBINE ENGINE NACELLE HAVING A SYMMETRIC FLOWPATH AND DESIGN METHOD THEREOF

CROSS-REFERENCE TO RELATED APPLICATIONS

This application is a divisional application of U.S. application Ser. No. 12/495,867, filed Jul. 1, 2009, and claims priority to British Patent Application No. GB 0813482.7, filed on Jul. 24, 2008. The prior applications, including the specifications, drawings and abstracts are incorporated herein by reference in their entirety.

The present invention relates to a gas turbine engine nacelle and in particular to a turbofan gas turbine engine nacelle.

BACKGROUND

A turbofan gas turbine engine nacelle intake is required to supply the fan of the turbofan gas turbine engine with favourably conditioned air during all operational conditions of the turbofan gas turbine engine, irrespective of the aircraft environment and aircraft attitude, whether the aircraft is in flight or on the ground. The nacelle intake may also be required to absorb noise generated by the gas turbine engine.

Prior art nacelle intakes are designed to minimise the pressure loss of the intake at the maximum incidence the aircraft experiences in flight and at the maximum crosswind conditions on the ground. For example, good pressure recovery at high incidence can be achieved by attempting to ensure that the air flow remains attached to the bottom lip of the nacelle intake by drooping down the nacelle highlight and throat relative to the axis of the fan of the turbofan gas turbine engine.

SUMMARY

Figure 1:
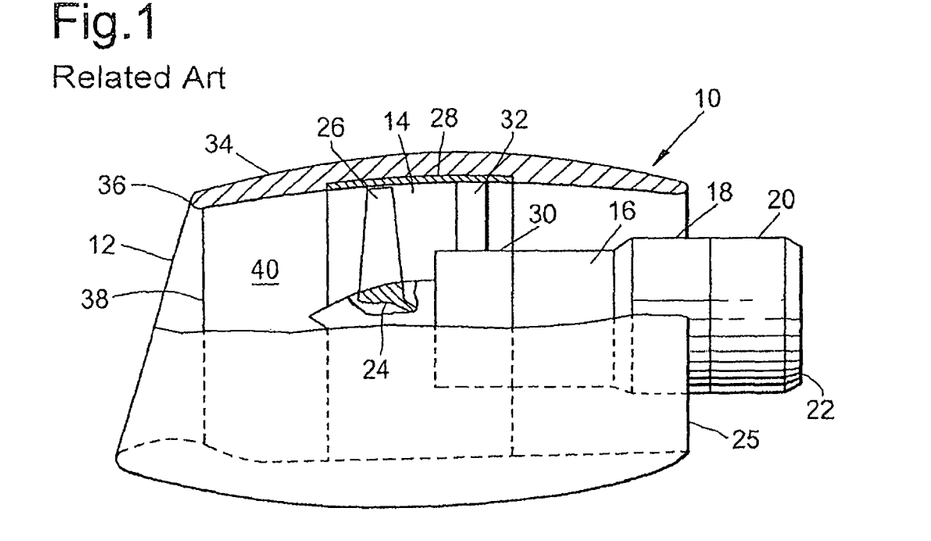
FIG. 1 is a partially cut away view of a known turbofan gas turbine engine.

FIG. 1 is a partially cut away view of a turbofan gas turbine engine having, in axial flow series, an intake 12, a fan section 14, a compressor section 16, a combustion section 18, a turbine section 20 and an exhaust 22. The fan section 14 comprises a fan disc 24 carrying a plurality of circumferentially spaced radially extending fan blades 26. The fan disc 24 and fan blades 26 are surrounded by a fan casing 28. The fan casing 28 is mounted from the core casing 30 by a plurality of radially extending fan outlet guide vanes 32. The fan section 14 is driven by a turbine in the turbine section 20 via a shaft (not shown). The compressor section 16 is driven by a turbine in the turbine section 20 by a shaft (not shown). The whole of the turbofan gas turbine engine 10 is placed within a nacelle 34.

Figure 2:
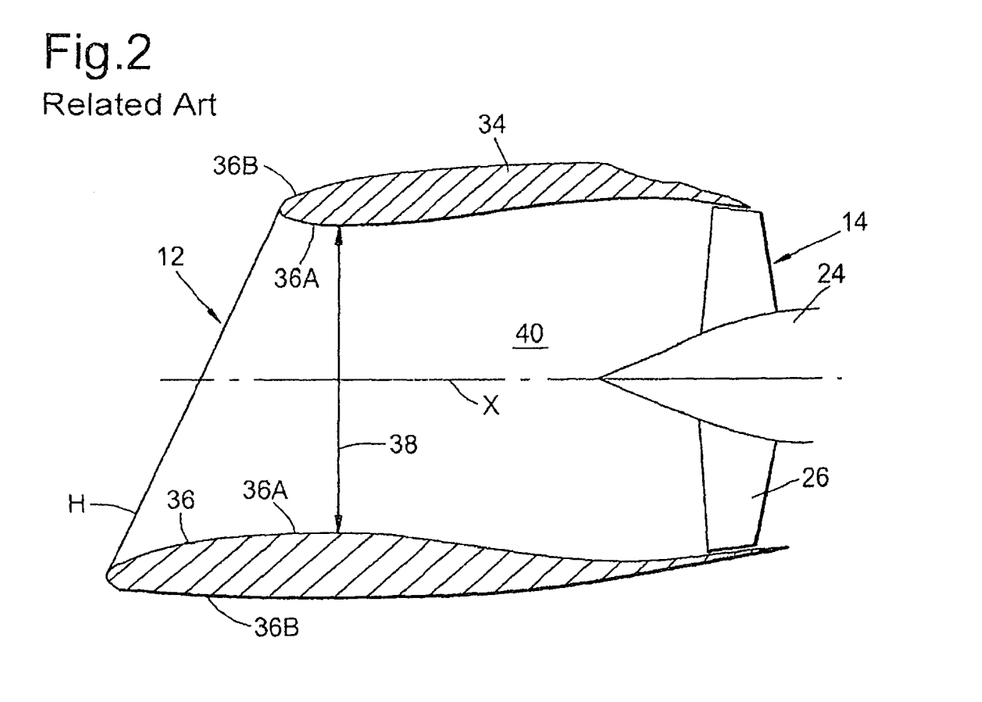
FIG. 2 is an enlarged vertical longitudinal cross-section, containing the engine axis X, through the intake of the turbofan gas turbine engine nacelle shown in FIG. 1.
Figure 3:
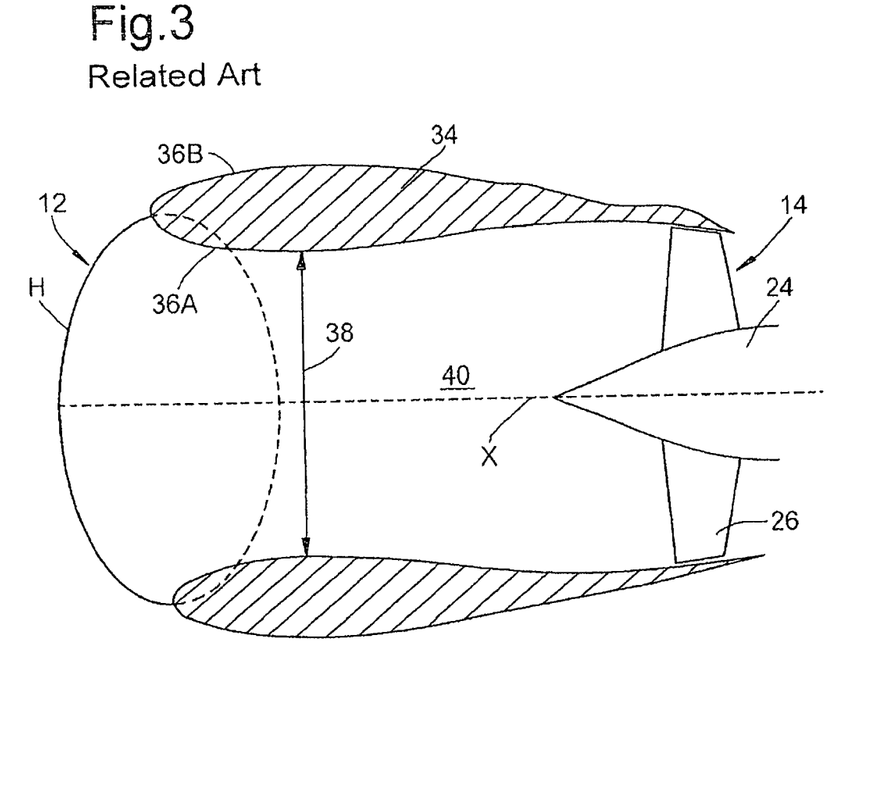
FIG. 3 is an enlarged horizontal longitudinal cross-section, containing the engine axis X, through the intake of the turbofan gas turbine engine nacelle shown in FIG. 1.

FIGS. 2 and 3 are respectively enlarged vertical and horizontal longitudinal cross-sections, containing the engine axis X, through the intake of the turbofan gas turbine engine nacelle shown in FIG. 1. The nacelle 34 has an intake 12 at its upstream end and an exhaust 25 at its downstream end. The nacelle 34 intake 12 comprises, in flow series, a flared intake lip 36, an intake throat 38 and a diffuser 40 upstream of the fan section 14 of the turbofan gas turbine engine 10. The intake lip 36 forms a contraction for the supply of air to the intake throat 38. The diffuser 40 is arranged to diffuse the air from the intake throat 38 to the fan section 14.

The intake lip has an inner surface 36A and an outer surface 36B. The highlight H is a closed loop running around the intake lip, and defines the boundary between the lip inner and outer surfaces. In FIG. 2 the highlight H is viewed edge on and is indicated by a solid line. In FIG. 3, the part of the highlight H below the plane of the drawing is indicated by a solid line, and the part above the plane of the drawing is indicated by a dashed line.

Generally, the highlight H lies in a highlight surface which is either planar or is curved in only one principal direction. On longitudinal sections through the engine containing the engine axis, the lip inner and outer surfaces are tangency matched at the highlight. Indeed, the lip inner and outer surfaces may be tangential to the highlight surface at the highlight. However, although the curvatures of the inner surface and outer surface are generally at a maximum at the highlight on a longitudinal section, these curvatures may not be the same maximum values. Thus it is typical for the lip to have a discontinuity in curvature across the highlight.

Travelling downstream along the inner surface 36A on a longitudinal section, the end of the inner surface 36A is reached when the tangent to the inner surface becomes 90° relative to the tangent to the inner surface on the same section at the highlight. Generally, on such a section, the curvature of the inner surface 36A decreases continuously in the direction from highlight to the downstream end. The position of the intake throat 38 can be taken to be the downstream end of the inner surface 36A.

A problem with nacelle intakes is that the flow path in the nacelle immediately upstream of the fan may not be symmetric. This can result in an asymmetric flow of air to the fan causing it to operate away from its optimum operating point and hence there is a loss of efficiency. Flow asymmetries may be cause, for example, by crosswinds.

Nacelle intakes may also not be optimised with respect to noise attenuation and other operational considerations.

Accordingly, a first aspect of the present invention provides a method of designing a nacelle for a gas turbine engine including the steps of:

defining an initial geometry for a nacelle, the initial geometry providing an intake at the upstream end of the nacelle and an exhaust at the downstream end of the nacelle, wherein the intake has, in flow series, an intake lip and a diffuser, the intake lip having a highlight defining a boundary between the inner and outer surfaces of the intake lip, and on all longitudinal sections through the nacelle that contain the longitudinal axis of the nacelle (i) said inner and outer surfaces having their tangents coincident at the highlight, and (ii) said inner and outer surfaces having their maximum curvatures at the highlight;

pivoting, at each of one or more positions on the highlight and in the plane of the respective longitudinal section, the upstream portion of the section of intake lip lying in the respective longitudinal section about the highlight; and adjusting surfaces of the intake neighbouring the pivoted upstream portion to smoothly blend the surfaces of the pivoted upstream portion to unadjusted surfaces of the intake further removed from the pivoted upstream portion to obtain an altered geometry for the nacelle. Typically, the defining, pivoting and obtaining steps are performed on a computer system.

This aspect of the invention allows a designer to exert great control over intake lip geometry, so that specific issues can be addressed, such as noise reduction, reduction in flow asymmetries etc.

The positions at which the front portions of the intake lip sections are pivoted are typically the crown, keel and sideline midpoint positions. However, the method can be applied to pivot upstream portions at any circumferential position on the highlight.

Typically, the highlight lies in a highlight surface which is either planar or is curved in only one principal direction, for example in the manner of a cylindrical paraboloid, although more complex shapes are possible. Indeed, when the initial nacelle geometry has such a highlight surface, on all longitudinal sections of that initial geometry, the inner and outer surfaces of the intake lip may be tangential to the highlight surface at the highlight. Typically, in this case, the pivoting step then results in the or each pivoted upstream portion crossing a tangent to the highlight surface at the position of that pivoted upstream portion.

Preferably, in the pivoting step, the or each front portion is pivoted by at most 5°. However, significant aerodynamic changes can be obtained with smaller rotations. Therefore, preferably, in the pivoting step, the or each front portion is pivoted by at least 0.1° or 0.25°. Typically, in the pivoting step, the or each front portion is pivoted by an angle in the range from 1° to 2.5°.

A further aspect of the invention provides a method of producing a nacelle for a gas turbine engine, including the steps of:

designing a nacelle according to the method of the previous aspect; and manufacturing a nacelle having the altered geometry.

Another aspect of the invention provides a nacelle for a gas turbine engine, the nacelle having an intake at the upstream end of the nacelle and an exhaust at the downstream end of the nacelle, and the intake having, in flow series, an intake lip and a diffuser, wherein:

the intake lip has a highlight which is a closed loop defining a boundary between inner and outer surfaces of the intake lip, the highlight lying in a highlight surface which is either planar or is curved in only one principal direction (for example in the manner of a cylindrical paraboloid);

in an initial geometry, on all longitudinal sections through the nacelle that contain the longitudinal axis of the nacelle (i) said inner and outer surfaces have their tangents coincident at the highlight, and (ii) said inner and outer surfaces have their maximum curvatures at the highlight; and in an altered geometry, at each of one or more positions on the highlight, and in the respective longitudinal section, a portion of the intake lip crosses a tangent to the highlight surface at that position and surfaces of the intake neighbouring that portion of the intake lip are adjusted to provide smoothly blended surfaces.

Thus the nacelle can be one having an altered geometry designed by the method of the first aspect.

Preferably, on all longitudinal sections, the angle between the tangent to the inner and outer surfaces at the highlight and the tangent to the highlight surface is at most 5°, and more preferably at most 2.5°. Preferably, there is at least one longitudinal section for which the angle between the tangent to the is inner and outer surfaces at the highlight and the tangent to the highlight surface is at least 0.1° and more preferably at least 0.25° or 1°.

A further aspect of the invention provides a gas turbine engine including a nacelle according to the previous aspect.

BRIEF DESCRIPTION OF THE DRAWINGS

Figure 4:
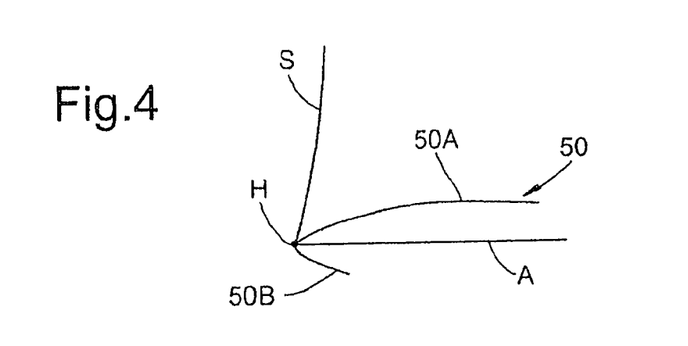
FIG. 4 shows the front portion of the section of intake lip at the keel position of a nacelle on a longitudinal cross-section containing the engine axis.

Embodiments of the invention will now be described by way of example with reference to the accompanying drawings in which:

FIG. 4 shows the front portion of the section of intake lip 50 at the keel position of a nacelle on a longitudinal cross-section containing the engine axis.

DETAILED DESCRIPTION

The intake lip 50 has inner 50A and outer 50B surfaces, which meet at a highlight H at the front of the nacelle. The highlight H lies in a curved highlight surface S which, in FIG. 4, is viewed edge-on. In FIG. 4, the highlight surface S is curved in the vertical direction of the page and is uncurved in the direction perpendicular to the page, i.e. it is curved in only one principle direction. However, in other examples, the highlight surface S may simply be planar.

The inner 50A and outer 50B surfaces are tangency matched at the highlight H, and indeed are tangential to the highlight surface S at the highlight H. The inner 50A and outer 50B surfaces also have their maximum curvatures at the highlight H. However, these curvatures are different for the inner 50A and outer 50B surfaces, whereby there is a discontinuity in curvature across the highlight.

The intake lip axis A lying in the plane of the drawing of FIG. 4 extends from the highlight H parallel to the engine axis, or to the intake droop axis in the case of a drooped intake.

The intake lip shown in FIG. 4 represents a geometry for the nacelle, resulting, for example, from an initial nacelle design procedure.

Figure 5:
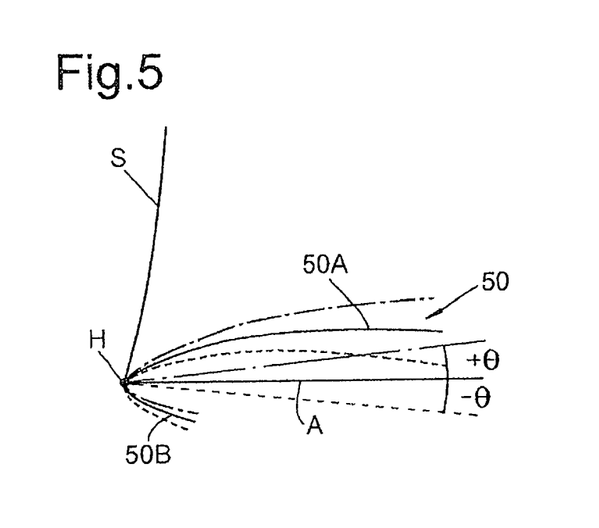
FIG. 5 shows the intake lip of FIG. 4 rotated about the highlight.
Figure 6:
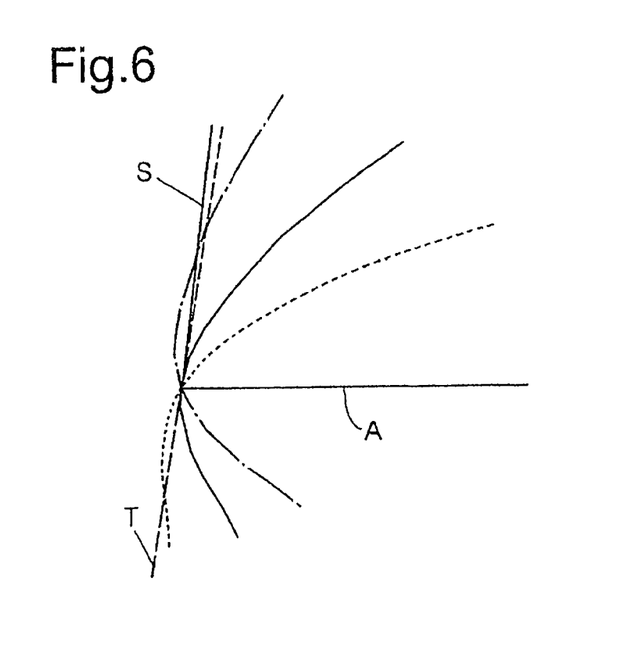
FIG. 6 is a close-up view of the forwardmost part of the rotated intake lip of FIG. 5.
Figure 7:
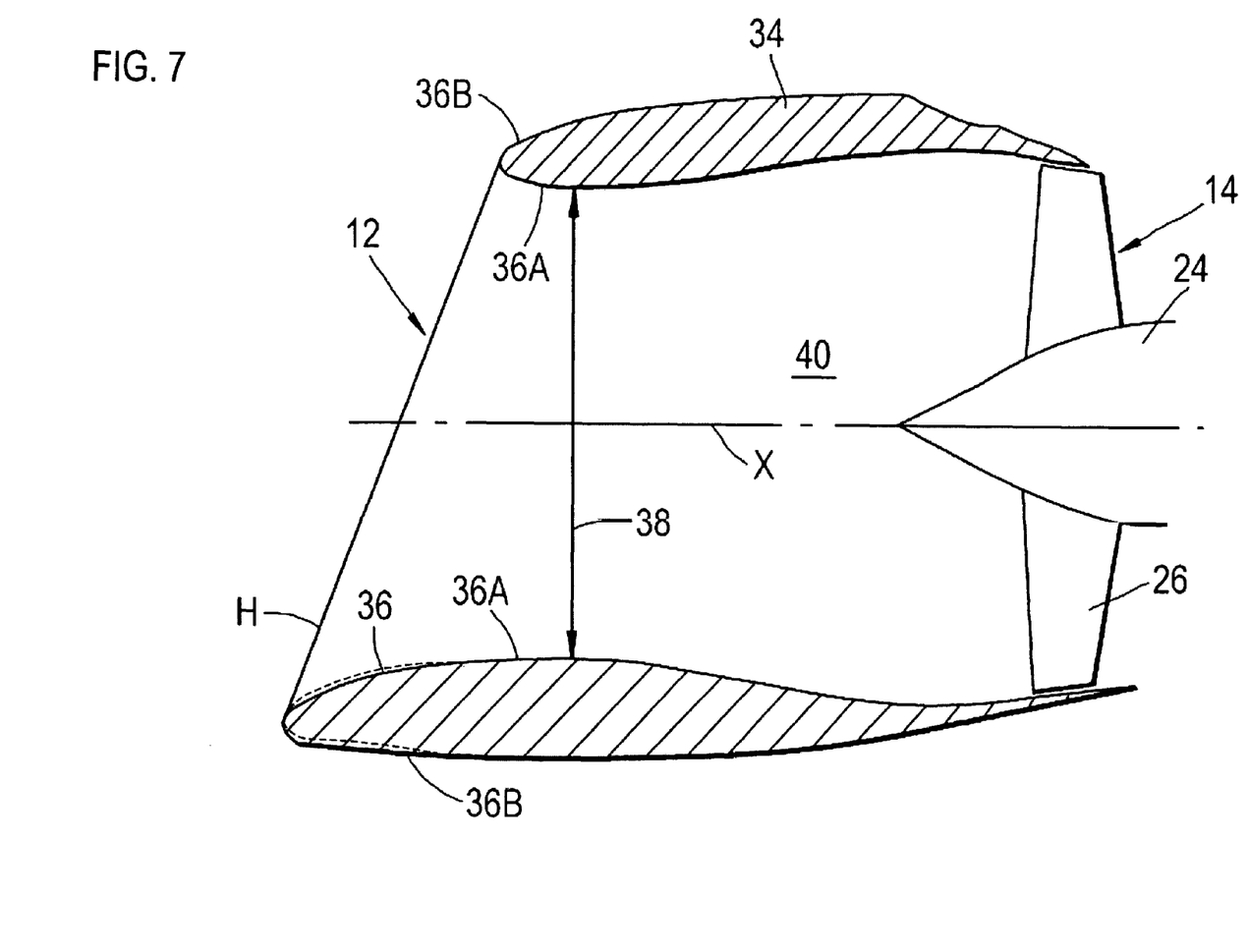
FIG. 7 is an enlarged vertical longitudinal cross-section through the intake of the turbofan gas turbine engine nacelle showing a portion of the intake lip pivoted about the highlight.

A next step in the design procedure is to pivot, in the plane of the respective longitudinal section, the front portion of the intake lip about the highlight H in a direction which rotates axis A either towards the engine axis (+θ, dot-dashed lines) or away from the engine axis (−θ, dotted lines), as shown in FIG. 5, and in more detail in FIG. 6, which is a close-up view of the forwardmost part of the rotated intake lip. FIG. 7 represents an example of a vertical longitudinal cross-section of a nacelle according to the present invention with a portion of the intake lip pivoted, as indicated by the dashed lines.

The tangent T to the highlight surface S at the highlight H is indicated with a dashed line in FIG. 6. Of course, if the highlight surface S is planar, the tangent T to the highlight surface S will be coincident with that surface. Because the inner 50A and outer 50B surfaces of the intake lip 50 are tangential to the highlight surface S at the highlight H in the initial geometry of FIG. 4, the +θ rotation has the effect of causing the inner surface 50A to cross the tangent T inwards of axis A, whereas the −θ rotation has the effect of causing the outer surface SOB to cross the tangent T outwards of axis A.

Having rotated the part of the front portion of the intake lip at the keel position, the next step in the design procedure is to adjust the surfaces of neighbouring parts of the intake to smoothly blend the surfaces of the rotated front keel part with the surfaces of unadjusted parts of the intake further removed from the rotated part. This blending can be performed by methods known to the skilled person.

Figure 8:
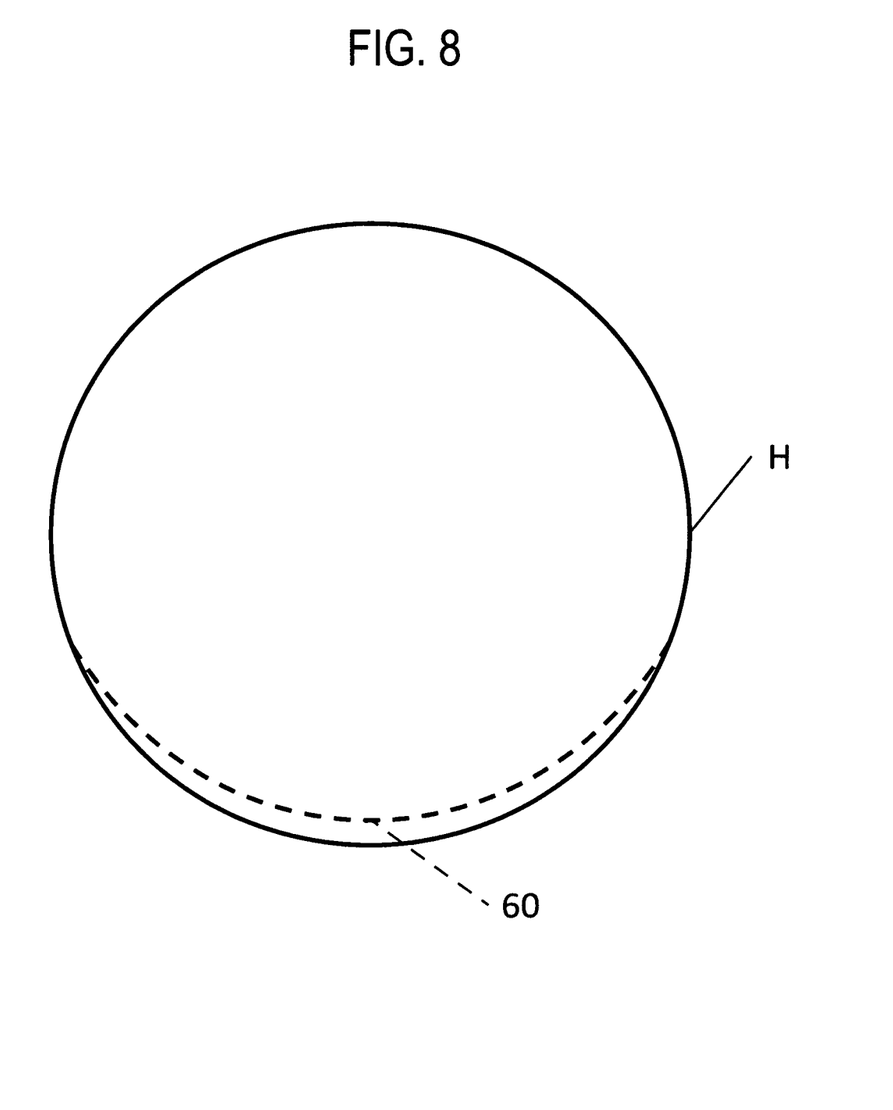
FIG. 8 is a highly schematic view of the front of the intake lip showing the highlight H and the position of the forwardmost portion of the intake lip before and after pivoting.

FIG. 8 shows the highlight H and the position of the forward-most portion of the intake lip before and after pivoting. Before pivoting, the forward-most portion of the intake lip is a loop that is coincident with the highlight H. After pivoting, the forward-most portion of the intake lip at bottom dead center (i.e., the dotted line 60) is spaced from the highlight H, and then blends through circumferentially neighboring surfaces with unadjusted surfaces of the intake lip toward the horizontal center of the highlight.

If the intake lip is rotated at just one position, such as the keel section discussed above, the adjustment procedure effectively results in an altered nacelle geometry in which the angle of rotation of the intake lip reduces around the highlight from a maximum amount at that section down to zero at a circumferential distance from the section, those parts of the intake lip having some rotation defining a transitional sector.

Thus, for example, lip rotation can be by an appropriate angle ±θ at a specific circumferential location to locally address a specific aerodynamic performance issue (e.g. high incidence at the keel, or crosswind at the sidelines), with θ smoothly transitioning to zero away from that circumferential location. The extent of the transition can be varied and the variation of θ within the transitional sector can be linear or controlled by an appropriate non-linear expression as a function of circumferential location.

However, more complicated adjustments can be effected. For example, lip rotation can be by an appropriate angle ±θ at a specific circumferential location to locally address a specific aerodynamic performance issue, with θ smoothly transitioning to a different ±θ elsewhere on the intake, itself transitioning to another ±θ at yet another part of the intake and so on, such that the θ variation is determined by respective rotations on multiple control sections. The variation of θ within each transitional sector can be linear or controlled by an appropriate non-linear expression as a function of circumferential location.

The external frontal area of the nacelle may be altered as a result of the altered geometry.

In the case of a −θ rotation the pivoting results in a shift of the local throat forwards, whereas in the case of a +θ rotation the pivoting results in a shift of the local throat rearwards. In general, care should be taken to ensure that the throat area does not become too small as a result of rotations.

Typical rotation angles are between 1° and 2.5°. However, even small rotations, for example around 0.25° or even 0.1°, can have significant aerodynamic impacts. Some situations may call for rotation angles of up to about 5°.

Pivoting the intake lip at specific positions around the highlight allows intake lip profiles to be de-coupled and individually optimised to locally address specific aerodynamic performance issues. For example:

Higher angles of attack can be produced by rotating lip sections in the lower half of the intake towards the engine axis (+θ).

For a negatively scarfed intake, more aggressive diffusion can be generated at the keel without dropping the intake bottom line by rotating the keel intake lip towards the engine axis (+θ). The larger diffuser angles further rearward in the duct which can then be produced can provide benefits in terms of reduced diffuser length, increased nacelle ground clearance and reduced fan face pressure distortion. For a positively scarfed intake, less diffusion at the keel may be beneficial and can be generated by rotating the keel intake lip away from the engine axis (−θ).

Enhanced crosswind capabilities can be obtained by rotating the sideline lips towards the engine axis (+θ).

Elimination or reduction of shock buzz noise during ground static operation can be obtained by rotating the crown lip axis to better align the intake lip with the bulk flow. External drag benefits may also be produced due to resulting changes in the shape of the external nacelle top surface. The rotation at the crown can be towards (+θ) or away from (−θ) the engine axis, depending on local flow conditions.

More generally, locally pivoting the intake lip can also provide the following benefits:

Lip profiles, throat area and local throat positions can be redistributed without changing the highlight shape.

The greater control over lip geometry enables nacelle designs in which asymmetries in the flow entering the intake duct are minimised, resulting in noise benefits due to reduced flow asymmetry around the intake lip and/or benefits associated with reduced fan forcing or fan face pressure distribution further downstream.

Intake lip rotation can enhance the design of negatively scarfed intakes, such that duct flow asymmetry downstream of the lip is reduced while tolerance to off-design external flows is maintained.

While the invention has been described in conjunction with the exemplary embodiments described above, many equivalent modifications and variations will be apparent to those skilled in the art when given this disclosure. For example, although the procedures of pivoting a part of the front of the intake lip and then adjusting neighbouring surfaces are described above in relation to a nacelle having a highlight surface which is a plane or is curved in only one principle direction and having inner and outer surfaces which are tangential to the highlight surface at the highlight, they may also be applied to nacelles having highlights which do not lie in such highlight surfaces, and/or having inner and outer surfaces which are not tangential to the highlight surface at the highlight. For example, a nacelle which has undergone the pivoting and adjusting procedures will have inner and outer surfaces which are not tangential to the highlight surface at the highlight. However, the procedures can nonetheless be reapplied to this nacelle. Accordingly, the exemplary embodiments of the invention set forth above are considered to be illustrative and not limiting. Various changes to the described embodiments may be made without departing from the spirit and scope of the invention.

What is claimed is:

1. A method of manufacturing a nacelle for a gas turbine engine, the method comprising:
   designing the nacelle in accordance with the following steps:
      defining an initial geometry for a nacelle, the initial geometry providing an intake at an upstream end of the nacelle and an exhaust at a downstream end of the nacelle, wherein the intake has, in flow series, an intake lip and a diffuser, the intake lip having a highlight which is a closed loop defining a boundary between inner and outer surfaces of the intake lip, and on all longitudinal sections through the nacelle that contain a longitudinal axis of the nacelle (i) said inner and outer surfaces having their tangents coincident at the highlight, and (ii) said inner and outer surfaces having their maximum curvatures at the highlight;

pivoting, at each of one or more positions on the highlight and in a plane of the respective longitudinal section, a portion of the intake lip lying in the respective longitudinal section about the highlight; and adjusting surfaces of the intake neighbouring the pivoted portion to blend surfaces of the pivoted portion with unadjusted surfaces of the intake further removed from the pivoted portion to obtain an altered geometry for the nacelle, wherein the steps of defining, pivoting and adjusting are performed on a computer; and manufacturing the designed nacelle.

2. The method of manufacturing a nacelle according to claim 1, wherein the highlight lies in a highlight surface which is either planar or is curved in only one principal direction.

3. The method of manufacturing a nacelle according to claim 2, wherein, in the initial geometry, on all longitudinal sections, said inner and outer surfaces are tangential to the highlight surface at the highlight.

4. The method of manufacturing a nacelle according to claim 3, wherein the pivoting step results in the or each pivoted portion crossing an original tangent to the highlight surface of the initial geometry at the position of that pivoted portion.

5. The method of manufacturing a nacelle according to claim 1, wherein, in the pivoting step, the or each pivoted portion is pivoted by at most 5°.

6. A method of manufacturing a nacelle for a gas turbine engine, the method comprising:

designing the nacelle in accordance with the following steps:

providing an intake portion at an upstream end of the nacelle, the intake portion having in flow series:

an intake lip, and a diffuser;

providing an exhaust portion at a downstream end of the nacelle, wherein the intake lip has a highlight which is a closed loop defining a boundary between an inner surface of the intake lip and an outer surface of the intake lip, at which a tangent to the inner surface is coincident with a tangent to the outer surface;

configuring the highlight to lie in an original highlight surface which is either planar or curved in only one principal direction; and configuring one portion of the intake lip, such that (i) at each of one or more, but not all, positions on the highlight, and in a respective longitudinal section through the nacelle, the one portion of the intake lip crosses an original tangent to the original highlight surface at that position on the highlight and (ii) surfaces of the intake lip neighbouring the one portion of the intake lip are adjusted to provide blended surfaces, wherein the steps of providing and configuring are performed on a computer; and manufacturing the designed nacelle.

7. The method of manufacturing a nacelle according to claim 6, wherein, on all longitudinal sections, said inner and outer surfaces are tangential to the original highlight surface at the highlight.

8. The method of manufacturing a nacelle according to claim 6, wherein an angle between the tangent to the inner surface and the tangent to the outer surface at the highlight and the tangent to the original highlight surface is at most 5°.

* * * * *